United States Patent [19]
Ohta

[11] Patent Number: 5,475,643
[45] Date of Patent: Dec. 12, 1995

[54] SEMICONDUCTOR SIGNAL LINE SYSTEM WITH CROSSTALK REDUCTION

[75] Inventor: Yoshiji Ohta, Ikoma, Japan

[73] Assignee: Sharp Kabushiki Kaisha, Japan

[21] Appl. No.: 150,243

[22] Filed: Nov. 9, 1993

Related U.S. Application Data

[63] Continuation of Ser. No. 617,819, Nov. 26, 1990, abandoned.

[30] Foreign Application Priority Data

Nov. 29, 1989 [JP] Japan ..................... 1-310459

[51] Int. Cl.⁶ ..................... G11C 5/06; G11C 7/02
[52] U.S. Cl. ..................... 365/206; 365/51; 365/63; 365/69
[58] Field of Search ..................... 365/51, 63, 69, 365/70, 190, 202, 206; 370/6; 375/34; 340/855.4

[56] References Cited

U.S. PATENT DOCUMENTS

| | | | |
|---|---|---|---|
| 3,303,481 | 2/1967 | Kessler | 365/69 |
| 4,238,838 | 12/1980 | Wright et al. | 365/69 |
| 4,916,661 | 4/1990 | Nawaki et al. | 365/51 |
| 4,922,459 | 5/1990 | Hidaka | 365/206 |
| 4,980,860 | 12/1990 | Houston et al. | 365/206 |
| 4,982,368 | 1/1991 | Arimoto | 365/51 |
| 5,060,189 | 10/1991 | Ota | 365/51 |
| 5,062,077 | 10/1991 | Takashima et al. | 365/59 |
| 5,089,992 | 2/1992 | Shinohara | 365/51 |
| 5,144,583 | 9/1992 | Oowaki et al. | 365/206 |
| 5,155,700 | 10/1992 | Min et al. | 365/63 |

OTHER PUBLICATIONS

M. Tsukude et al, "A Memory Array Architecture For 16Mb Drams", SDM89-31, 1989, pp. 73–74.

*Primary Examiner*—Jack A. Lane
*Attorney, Agent, or Firm*—Nixon & Vanderhye

[57] ABSTRACT

An improved signal line system for lines such as bit lines for a semiconductor memory is disclosed. In the signal line system, a first pair of signal lines cross each other at at least one point. At least one portion of one of the signal lines of a second pair is disposed between the signal lines of the first pair. At least one portion of one of the signal lines of a third pair is disposed between one of the signal lines of the first pair and the one signal line of the second pair. At least one portion of one of the signal lines of a fourth pair is disposed to a side of the other one of the signal lines of the first pair. At least one portion of one of the signal lines of a fifth pair is disposed to a side of one of the signal lines of the first pair. The level of the crosstalk between the signal lines can be effectively reduced.

10 Claims, 3 Drawing Sheets

SEMICONDUCTOR SIGNAL LINE SYSTEM WITH CROSSTALK REDUCTION

This is a continuation of application Ser. No. 07/617,819, filed Nov. 26, 1990, now abandoned.

BACKGROUND OF THE INVENTION

1. Field of the Invention

This invention relates to a signal line system, and more particularly to a signal line system used in a semiconductor memory or the like in which crosstalk between signal lines can be effectively prevented.

2. Description of the Prior Art

Semiconductor production techniques have shown remarkable progress in recent years, and various elements which constitute semiconductor integrated circuits are becoming smaller in size. As a result of this technological progress, integrated circuits are mounted on a semiconductor substrate with a greater density and with a greater functionality. This has also narrowed the distance between signal lines disposed on the substrates.

Particularly in the case of dynamic semiconductor memory devices, the crosstalk between signal lines which transfer very-low level signals output from memory cells to sense amplifiers greatly effects the reliability of the product as the integrating density increases. Therefore, signal line systems having a configuration for preventing the crosstalk have been proposed.

FIG. 3 shows one example of such conventional signal line systems ("A Memory Array Architecture for 16 Mb DRAMs", M. Tsukude et al., SDM89-31, 1989). The system shown in FIG. 3 comprises four pairs of signal lines (bit lines) which connect memory cells (not shown) with sense amplifiers S1–S4, respectively. More specifically, the first pair (signal lines B1 and B#1) is connected to the sense amplifier S1, the second pair (signal lines B2 and B#2) to the sense amplifier S2, the third pair (signal lines B3 and B#3) to the sense amplifier S3, and the fourth pair (signal lines B4 and B#4) to the sense amplifier S4. In each of the signal line pairs B1 and B#1, B2 and B#2, B3 and B#3, the two signal lines are arranged so that they cross each other and so that the crossing of one signal line pair opposes the straight part of another signal line pair.

In such a signal line system of the prior art, even if signals passing through the signal lines B2 and B#2 are induced as a crosstalk signal on the signal line B1 which is disposed adjacent to both the signal lines B2 and B#2, the signals on the signal lines B2 and B#2 are opposite in phase. Therefore, the crosstalk signals induced on the signal line B1 are also opposite in phase, which causes them to cancel each other. A similar kind of crosstalk cancellation effect is obtained between adjacent signal line pairs. That is, the crosstalk induced by each of the signal line pairs can be reduced by the crossings in the signal line pairs.

In a signal line system of the prior art having such a configuration, the crosstalk between adjacent signal line pairs can be reduced, while the crosstalk between signal lines of the same pair (i.e., between the respective signal lines B1 and B#1, B2 and B#2, B3 and B#3, and B4 and B#4) which are connected to the respective sense amplifiers S1 to S4 cannot be reduced. Furthermore, since the signals output from the same memory cell to the corresponding one of the sense amplifiers S1 to S4 are always opposite to each other in phase, this kind of crosstalk further attenuates the signal level, which reduces the margin of each of the sense amplifiers S1 to S4.

SUMMARY OF THE INVENTION

The signal line system of this invention, which overcomes the above-discussed and numerous other disadvantages and deficiencies of the prior art, comprises: a first pair of signal lines, said signal lines of said first pair crossing each other in at least one point; a second pair of signal lines, at least one portion of one of said signal lines of said second pair being disposed between said signal lines of said first pair; a third pair of signal lines, at least one portion of one of said signal lines of said third pair being disposed between one of said signal lines of said first pair and said one signal line of said second pair; a fourth pair of signal lines, at least one portion of one of said signal lines of said fourth pair being disposed along the other one of said signal lines of said first pair; and a fifth pair of signal lines, at least one portion of one of said signal lines of said fifth pair being disposed along said one of said signal lines of said first pair.

In a preferred embodiment, said signal lines of said second pair cross each other at at least one point.

In a preferred embodiment, said signal lines of said third pair cross each other at at least one point.

In a preferred embodiment, said signal lines of said fourth pair cross each other at at least one point.

In a preferred embodiment, said signal lines of said fifth pair cross each other at at least one point.

In a preferred embodiment, the crossing points of said signal lines correspond to the straight portion of the adjacent signal line.

In a preferred embodiment, said signal lines are bit lines connected between memory cells and sense amplifiers, respectively.

In the above configuration, the signal lines constituting the first pair can be separated from each other by a sufficiently large distance, whereby the level of the crosstalk between these signal lines can be effectively reduced. Crosstalk signals originating in the signals on the signal lines of the first pair and each having the phase relationship opposite to each other are induced on the signal lines of the second and third pairs which are disposed between the signal lines of the first pair, so that these crosstalk signals on the signal line of the second or third pair cancel each other.

Thus, the invention described herein makes possible the objectives of:

(1) providing a signal line system in which the level of the crosstalk between signal lines connected to the same sense amplifier can be reduced;

(2) providing a signal line system in which the level of the crosstalk between two pairs of signal lines can be reduced; and (3) providing a signal line system in which the signal level of a signal line is not reduced.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
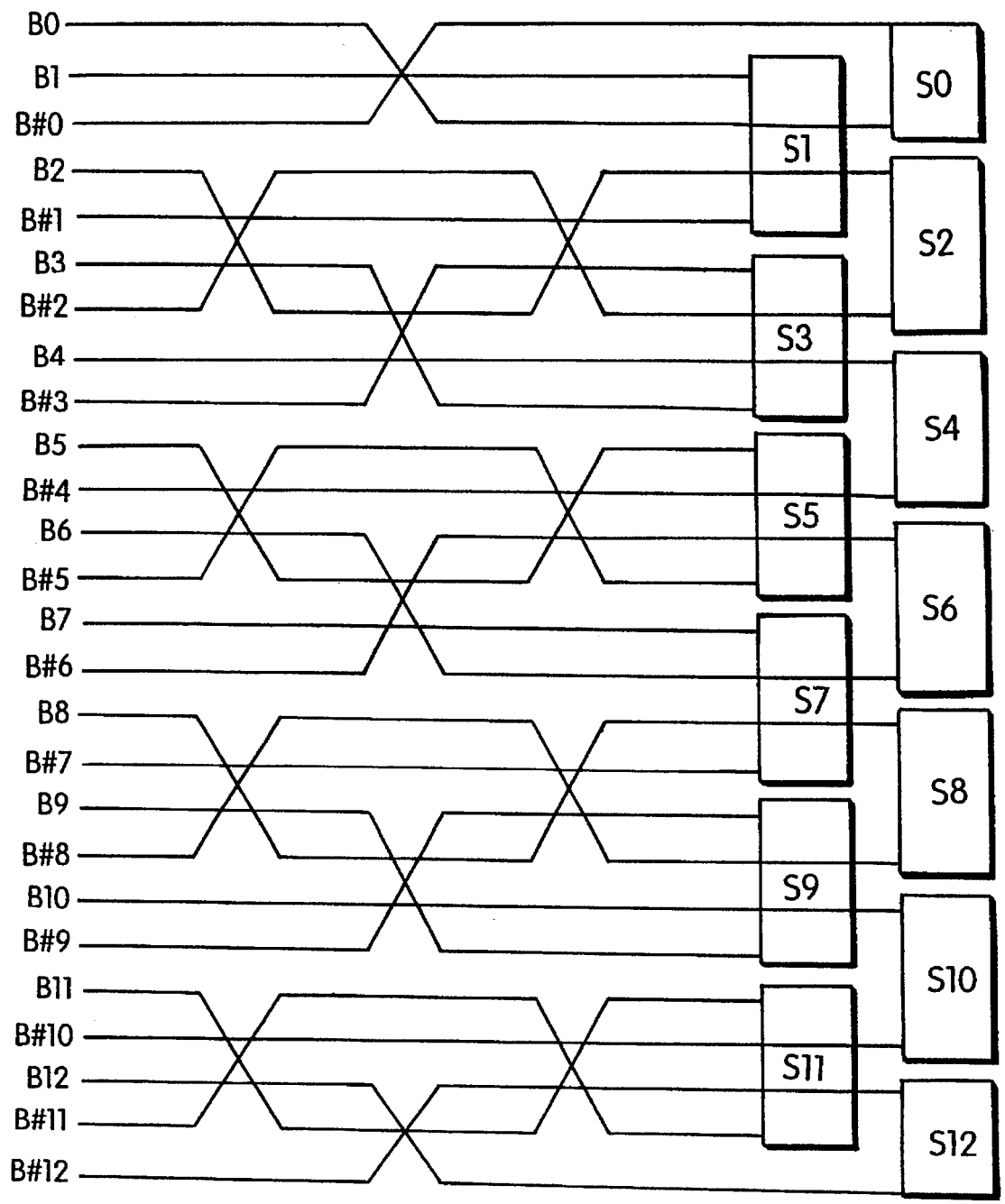
FIG. 1 is a diagram partially illustrating a signal line system according to the invention.

FIG. 1 shows a signal line system according to the invention. The signal line system of FIG. 1 is a bit line system used in a semiconductor memory. In FIG. 1, signal lines B0 to B#12 which constitute thirteen pairs of signal lines are shown. Each pair of the signal lines is connected to sense amplifiers S0 to S12, respectively. The signal lines B2 and B#2, B5 and B#5, B8 and B#8, and B11 and B#11 cross at two points (the one quarter point and the three quarter point), respectively. The signal lines B1 and B#1, B4 and B#4, B7 and B#7, and B10 and B#10 are straight lines. In FIG. 1, for example, the signal lines B2 and B#2 connected to the sense amplifier S2 constitute the first pairs, the signal lines B1 and B#1 connected to the sense amplifier S1 constitute the second pairs, the signal lines B3 and B#3 connected to the sense amplifier S3 constitute the third pairs, the signal lines B0 and B#0 connected to the sense amplifier S) constitute the fourth pairs, and the signal lines B4 and B#4 connected to the sense amplifier S4 constitute the fifth pair. The signal lines B0 and B#0, B3 and B#3, B6 and B#6, B9 and B#9, and B12 and B#12 cross at the midpoint, respectively. The positions of these crossing points correspond to the straight portions of the signal lines B1 to B#12.

Figure 2:
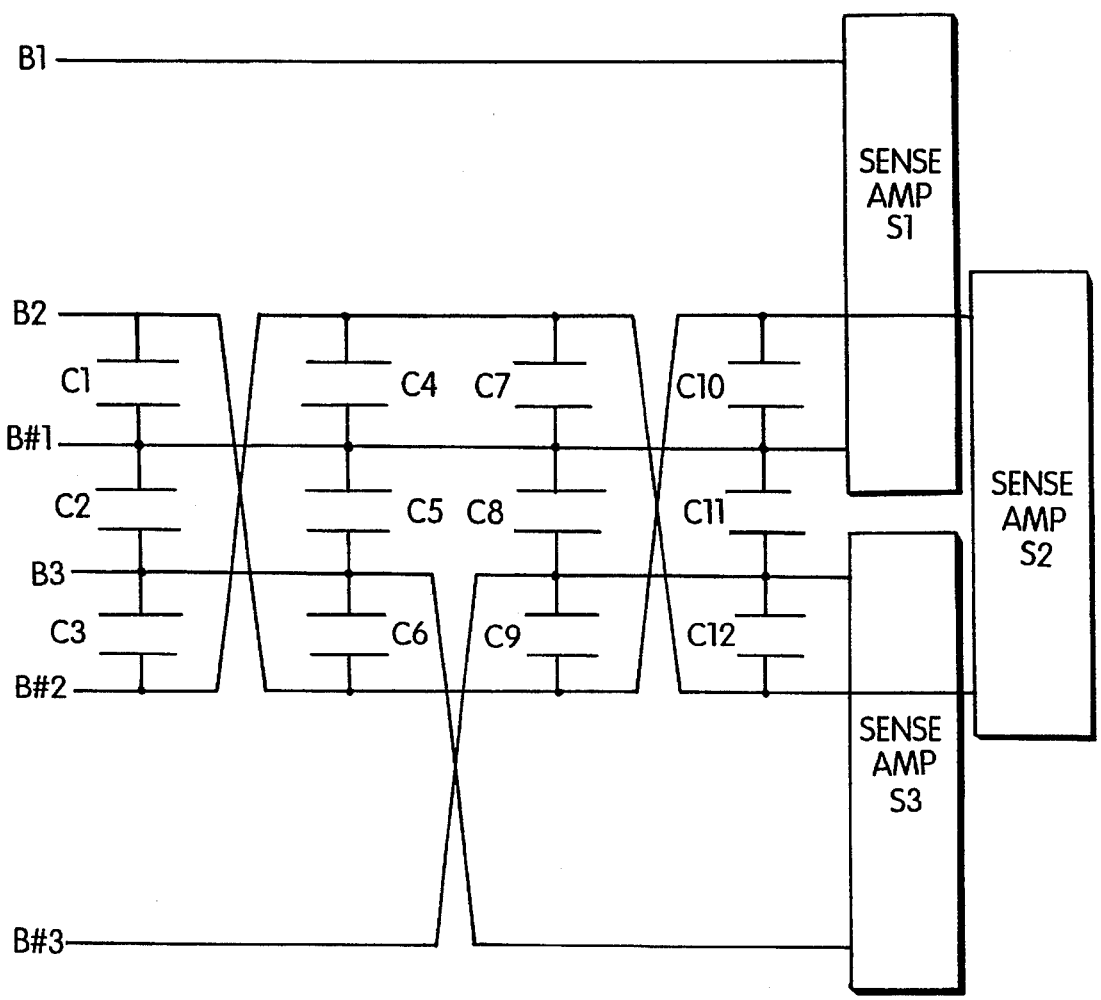
FIG. 2 is a diagram illustrating one portion of the signal line system of FIG. 1.

With reference to FIG. 2, the reduction of the crosstalk level in the system of FIG. 1 will be described.

Figure 3:
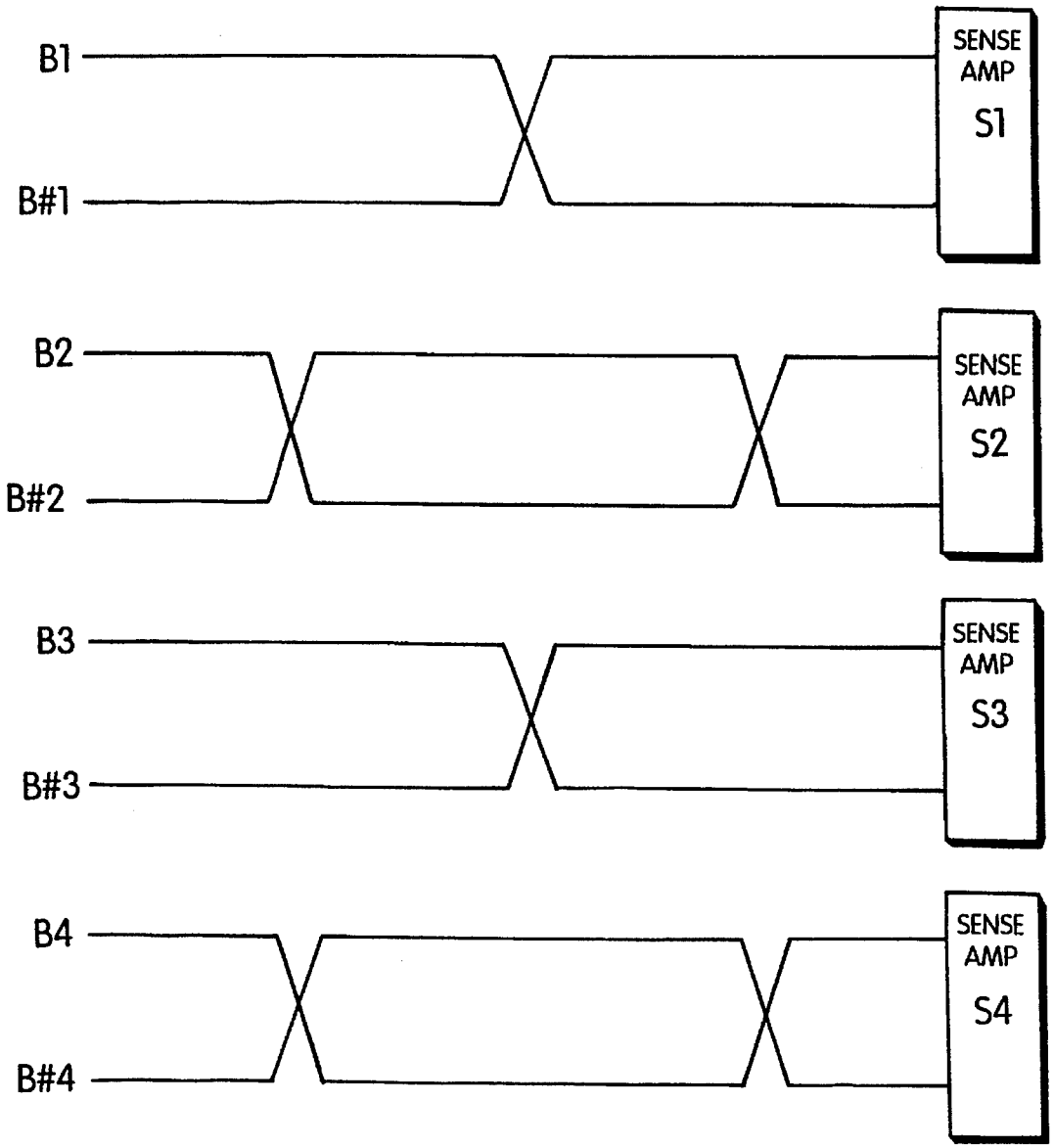
FIG. 3 is a diagram illustrating a conventional signal line system.

In FIG. 2 which shows one portion of the system of FIG. 1, some signal lines are omitted for the sake of simplicity. In FIG. 2, references C1 to C12 indicate parasitic capacitances per unit length which are produced between signal lines B#1, B2, B#2, and B3. The two signal lines B#1 and B3 which are respectively connected to the sense amplifiers S1 and S3 are disposed between the signal lines B2 and B#2 (which constitute the first pair as mentioned before). Therefore, the signal lines B2 and B#2 can be separated by a distance considerably larger than that in the conventional system of FIG. 3, resulting in that the level of the crosstalk between the signal lines B2 and B#2 is so low as to be negligible.

In contrast, the level of the crosstalk between the first pair and the second or third pair is reduced as follows. The signal line B#1 receives the crosstalk from the signal line B2 through the parasitic capacitances C1 and C10, and from the signal line B#2 through the parasitic capacitances C4 and C7. Since the signals on the signal lines B2 and S#2 are opposite in phase to each other, the crosstalk signals which appear on the signal line B#1 and which are caused by the signals on the signal lines B2 and B#2 are canceled. The signal line B#1 also receives the crosstalk from the signal line B3 through the parasitic capacitances C2 and C5, and from the signal line B#3 through the parasitic capacitances C8 and C11. Since the signals on the signal lines B3 and B#3 are opposite in phase to each other, the crosstalk signals which appear on the signal line B#1 and which are caused by the signals on the signal lines B3 and B#3 are canceled. In other words, the signal line B#1 is not influenced by crosstalk from either of the signal lines B2 and B#2, or B3 and B#3.

The signal line B2 receives the crosstalk from the signal line B#1 via the parasitic capacitances C1 and C10, while the signal line B#2 also receives the crosstalk from the signal line B#1 via the parasitic capacitances C4 and C7. In other words, both the signal lines B2 and B#2 receive the crosstalk signals from the signal line B#1 which are in phase. Therefore, the potential difference between the signal lines B2 and B#2 is not reduced by the crosstalk signals from the signal line B#1. Namely, the quality of the signals on the signal lines B2 and B#2 is not affected by the crosstalk signals from the signal line B#1. In addition, the signal line B2 also receives crosstalk from the signal B3 via the parasitic capacitance C6, and from the signal line B#3 via the parasitic capacitance C9. Since these crosstalk signals are opposite in phase to each other, the effect of the crosstalk on the signal line B2 can be effectively suppressed. The effect of the crosstalk on the signal line B#2 can also be reduced in the same way.

As seen from the above description, according to the invention, a signal line system is formed in which a first signal line pair is positioned so that the two lines are isolated from each other to prevent crosstalk between them and so they cross each other, and second and third signal pairs are positioned so that at least one signal line of each of the pairs is between and adjacent to the signal lines of the first signal line pair, whereby the effect of crosstalk between the signal lines is effectively reduced, the margin of each of the sense amplifiers is increased, and signal transmission loss is reduced while suppressing the drop in the level of the signals output to the sense amplifiers from the memory cells, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A signal line system for a plurality of signal lines comprising:

a first pair of signal lines for connecting a pair of devices, the pair of devices being separated from one another along a predetermined direction;

a second pair of signal lines, at least one portion of a first line of said signal lines of said second pair being disposed between said signal lines of said first pair, said signal lines of said second pair crossing each other at at least a first crossing point and a second crossing point;

a third pair of signal lines, at least one portion of a first line of said signal lines of said third pair being disposed between one of said signal lines of said first pair and said first signal line of said second pair, said signal lines of said third pair crossing each other at at least a third crossing point and wherein an adjacent first signal line adjacent to said second pair at said first crossing point is straight and parallel to said predetermined direction at a corresponding first point along said adjacent line, said corresponding first point along said adjacent first signal line being aligned with said first crossing point in a direction substantially perpendicular to said predetermined direction, wherein an adjacent second signal line adjacent to said second pair at said second crossing point is straight and parallel to said predetermined direction at a corresponding second point along said adjacent second signal, line, said corresponding second point along said adjacent second signal signal line being aligned with said second crossing point in a direction substantially perpendicular to said predetermined direction, wherein an adjacent third signal line adjacent to said third pair at said third crossing point is straight and parallel to said predetermined direction at a corresponding third point along said adjacent third signal line, said corresponding third point along said adjacent third signal signal line being aligned with said third crossing point in a direction substantially perpendicular to said predetermined direction, wherein said third crossing point is offset along said predetermined direction relative to said first and second crossing points, and wherein said each of said pairs of signal lines include bit lines connected between memory cells and sense amplifiers. respectively.

2. A signal line system according to claim 1, wherein said third point of said third pair occurs at a midpoint of said third pair.

3. A signal line system according to claims 1 or 2, wherein said signal lines of said first pair do not cross each other.

4. A signal line system for a plurality of signal lines extending in a longitudinal direction from memory cells to sense amplifiers, the signal line system comprising:

a first pair of signal lines for connecting a first memory cell to a first sense amplifier;

a second pair of signal lines for connecting a second memory cell to a second sense amplifier, at least one portion of a first of said signal lines of said second pair being disposed between said signal lines of said first pair;

a third pair of signal lines for connecting a third memory cell to a third sense amplifier, at least one portion of a first of said signal lines of said third pair being disposed between one of said signal lines of said first pair and said first signal line of said second pair, said signal lines of said third pair crossing each other at a crossing point of said third pair; and wherein an adjacent signal line adjacent to said third pair at said crossing point of said third pair is straight and parallel to the longitudinal direction at a corresponding point along the adjacent signal line, the corresponding point along the adjacent signal line being aligned with said crossing point of said third pair in a direction substantially perpendicular to said longitudinal direction.

5. A signal line system according to claim 4, wherein the corresponding point and the crossing point of said third pair are equally distanced along said longitudinal direction from said third sense amplifier.

6. A signal line system according to claim 4, wherein said signal lines of said second pair cross each other at at least one crossing point of said second pair.

7. A signal line system according to claim 6, wherein an adjacent signal line adjacent to said second pair at said crossing point of said second pair is straight and parallel to the longitudinal direction at a corresponding point along the adjacent signal line, the corresponding point being aligned with said crossing point of said second pair in a direction substantially perpendicular to said longitudinal direction.

8. A signal line system according to claim 4, wherein said signal lines of said second pair cross each other at a plurality of second pair crossing points, and said third pair of signal lines cross each other at a point which is in a predetermined relationship with respect to a distance along the longitudinal direction separating the second pair crossing points.

9. A signal line system according to claim 8, wherein said third pair of signal lines cross each other at a point which is midway between the second pair crossing points with respect to the longitudinal direction.

10. A signal line system according to claim 4, wherein both signal lines of a fourth pair are disposed to a first side of the first of the signal lines of said first pair, and wherein both signal lines of a fifth pair are disposed to a second side of a second of the signal lines of said first pair.

* * * * *